United States Patent
Kasko et al.

(10) Patent No.: US 6,875,652 B2
(45) Date of Patent: Apr. 5, 2005

(54) METHOD FOR PRODUCING FERROELECTRIC CAPACITORS AND INTEGRATED SEMICONDUCTOR MEMORY CHIPS

(75) Inventors: Igor Kasko, Fishkill, NY (US); Matthias Kroenke, Dresden (DE); Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/638,594

(22) Filed: Aug. 11, 2003

(65) Prior Publication Data

US 2004/0185578 A1 Sep. 23, 2004

Related U.S. Application Data

(63) Continuation of application No. PCT/DE01/04790, filed on Dec. 18, 2001.

(30) Foreign Application Priority Data

Feb. 9, 2001 (DE) .......................................... 101 05 997

(51) Int. Cl.$^7$ .......................................... H01L 21/8244
(52) U.S. Cl. ........................ 438/238; 257/303; 257/296
(58) Field of Search ............................ 438/3, 238, 239, 438/386, 240; 257/303, 296

(56) References Cited

U.S. PATENT DOCUMENTS

| | | | |
|---|---|---|---|
| 5,811,181 A | 9/1998 | Kijima et al. | |
| 5,930,659 A | 7/1999 | Klein et al. | |
| 6,168,991 B1 | 1/2001 | Choi et al. | |
| 2002/0003247 A1 | * | 1/2002 | Yokoyama et al. .......... 257/296 |
| 2002/0024079 A1 | * | 2/2002 | Nagano et al. .............. 257/300 |
| 2002/0036307 A1 | * | 3/2002 | Song .......................... 257/296 |
| 2002/0115253 A1 | | 8/2002 | Engelhardt et al. |
| 2002/0179956 A1 | * | 12/2002 | McTeer et al. .............. 257/308 |

FOREIGN PATENT DOCUMENTS

| | | |
|---|---|---|
| DE | 199 26 501 A1 | 12/2000 |
| EP | 0 911 871 A2 | 4/1999 |
| EP | 0 920 054 A1 | 6/1999 |

OTHER PUBLICATIONS

Christine Dehm et al.: "Review of $SrBi_2Ta_2O_9$ Thin Films Capacitor Processing", Integrated Ferroelectrics, vol. 26, 1999, No. 197.

* cited by examiner

Primary Examiner—Long Pham
Assistant Examiner—Nathan W. Ha
(74) Attorney, Agent, or Firm—Laurence A. Greenberg; Werner H. Stemer; Gregory L. Mayback

(57) ABSTRACT

The invention relates to a method for producing ferroelectric capacitors that are structured using the stack principle and that are used in integrated semiconductor memory chips. The individual capacitor modules have an oxygen barrier between a lower capacitor electrode and an electrically conductive plug. At a site where it is not covered by the corresponding oxygen barrier, an unstructured adhesive layer is oxidized by the oxygen arising during the tempering process of the ferroelectric and forms insulating segments at the site in such a way that the lower capacitor electrodes of the ferroelectric capacitors are electrically insulated from one another. This makes it possible to dispense with structuring the adhesive layer. Furthermore, the layer serves as a getter of oxygen and inhibits the diffusion of oxygen to the plug.

6 Claims, 2 Drawing Sheets

METHOD FOR PRODUCING FERROELECTRIC CAPACITORS AND INTEGRATED SEMICONDUCTOR MEMORY CHIPS

CROSS-REFERENCE TO RELATED APPLICATION

This application is a continuation of copending International Application No. PCT/DE01/04790, filed Dec. 18, 2001, which designated the United States and was not published in English.

BACKGROUND OF THE INVENTION

Field of the Invention

The invention relates to a method for producing ferroelectric capacitors, which are constructed using the stacked principle, in integrated semiconductor memory chips. An oxygen barrier is formed between a metallic bottom capacitor electrode of the ferroelectric capacitor and a conductive plug that connects the bottom capacitor electrode to a semiconductor electrode lying below the ferroelectric capacitor or to a metallization track. An adhesion layer made of a conductive material is formed between the plug and the oxygen barrier. A production method of this type is disclosed in Published German Patent Application DE 199 26 501 A1.

In order to produce ferroelectric capacitors for use in semiconductor memories having a high integration density, a ferroelectric material (for example $SrBi_2(Ta,Nb)_2O_9$ (abbreviated to SBT or SBTN), $Pb(Zr,Ti)O_3$ (abbreviated to PZT) or $Bi_4Ti_3O_{12}$ (abbreviated to BTO) is used as the dielectric between the electrodes of a capacitor. The capacitor electrode material is a noble metal or noble metal oxide that withstands high temperatures in $O_2$. Appropriate materials for this are Pt, Pd, Ir, Rh, Ru, RuOx, $IrO_x$, $RhO_x$, $SrRuO_3$, $LaSrCoO_x$ (abbreviated to LSCO), HT superconductors ($YBa_2Cu_3O_7$) etcetera. Generally, in the construction of capacitors, either the technologically more demanding stacked principle is followed or the procedure according to the offset cell principle, which takes up a much larger chip area, is followed (see "Integrated Ferroelectrics", 1999, 26, 197 by W. Hartner et al.).

Published German Patent Application DE 199 26 501 A1, cited above, reveals that an oxygen barrier is required in order to prevent an oxidation of the conductive plug that is composed of polysilicon or tungsten and that connects the bottom capacitor electrode to a semiconductor electrode or to a metallization track, in the case of the ferroelectric capacitor constructed according to the stacked principle. An adhesion layer is formed between the oxygen barrier, composed e.g. of Ir/IrOx, and the plug. The adhesion layer is necessary in order to keep down the contact resistance between the plug and the oxygen barrier and in order to prevent possible siliciding of Ir. Previous experiments have shown that, in the course of stepwise patterning the capacitor module (i.e. separately effected patterning of oxygen barrier, bottom electrode, ferroelectric and top electrode of the capacitor), the adhesion layer is oxidized from the side during a heat treatment in an oxygen atmosphere and thus interrupts the connection of the bottom capacitor electrode by the plug. The oxygen barrier can protect the adhesion layer and the plug from oxygen diffusion only in the vertical direction, but not in the horizontal direction.

It has likewise been found that the overlap of the bottom capacitor electrode over the underlying oxygen barrier is of great importance. The larger this overlap, the lower the extent to which oxygen diffuses from the side, and so the greater the number of capacitors that function. This is due to the fact that the horizontal oxidation of adhesion layer and plug progresses only slowly. Since the adhesion layer must be composed of a conductive material, it is necessary to pattern it since otherwise the adhesion layer would produce a short circuit between all the ferroelectric capacitors of the chip.

All present-day commercially available products with ferroelectric layers are constructed according to the offset cell principle and have an integration density of only a few kilobytes through to one megabyte. The offset cell principle does not require an oxygen barrier. In the stacked principle, the capacitor module is usually patterned stepwise with chlorine etchings. In other words, the oxygen barrier, the bottom capacitor electrode, the ferroelectric and the top capacitor electrode are patterned separately by chlorine etching.

In the ferroelectric capacitor constructed according to the stacked principle, a conductive oxygen barrier is necessary, as mentioned. Ir/IrOx is typically used as the material for the oxygen barrier. Ti, TiN, TaSiN, Ta or TaN, for example, can be used for the conductive adhesion layer with respect to the tungsten or polysilicon plug. Since the adhesion layer must be conductive, it is necessary to pattern it since it would otherwise electrically short-circuit all the capacitor modules.

U.S. Pat. No. 5,811,181 describes a method for producing a ferroelectric capacitor in which a tantalum-containing adhesion layer is deposited.

Published European Patent Application EP-A-0 911 871 describes that an adhesion layer composed of Ti is formed between a barrier metal layer, which is composed of TiN, of a ferroelectric capacitor formed according to the stacked principle and a conductive plug. However, the adhesion layer is patterned during the construction of the ferroelectric capacitor (See FIGS. 2B to 2D of the document.

U.S. Pat. No. 6,168,991 describes a capacitor constructed by the stacked method for a DRAM cell. The capacitor's bottommost layer, which adjoins a conductive plug, is an electrode layer which includes tantalum, tantalum nitride or a combination of tantalum and tantalum nitride and which simultaneously serves as a barrier layer and, in addition, imparts a good contact to an overlying dielectric film. This bottommost electrode layer including Ta/TaN is patterned during the production of the capacitor of the memory cell.

Published European Patent Application EP-A-0 920 054 describes a ferroelectric capacitor which is constructed according to the stacked principle and which has an adhesion layer composed of TiN, for example, between an underlying conductive plug and a bottom electrode layer. The adhesion layer is concomitantly patterned together with the overlying layers of the ferroelectric capacitor during the patterning into individual memory cells and experiences an undesirable oxidation from the side during the processing of the capacitor. In particular, during the ferroanneal in an oxygen atmosphere, the oxidized sections of the adhesion layer undesirably form a layer of high resistance (column 9, line 7 to line 12). For this reason, this document proposes performing the oxygen heat treatment prior to etching the platinum film which forms the bottom capacitor electrode, or if the etching has already taken place to a certain extent, but the side wall of the TiN adhesion layer is not yet uncovered. Thus, this document merely conveys the indication that a TiN adhesion layer is oxidized by an oxygen heat treatment. Nowhere, however, does this document describe that the oxidation of the TiN adhesion layer that remains unpatterned is brought about in a desired manner in order to simplify the patterning during the production of the ferroelectric memory cells.

SUMMARY OF THE INVENTION

It is accordingly an object of the invention to provide a method for producing ferroelectric capacitors in integrated semiconductor memory chips which overcomes the above-mentioned disadvantages of the prior art methods of this general type.

In particular, it is an object of the invention to design the method for producing ferroelectric capacitors in integrated semiconductor memory chips, which has been mentioned in the introduction, such that the patterning of the adhesion layer can be dispensed with, and at the same time, its premature oxidation can be retarded.

The invention is based on the insight that the adhesion layer is oxidized during the ferroanneal or heat treatment process in oxygen, which is carried out after the deposition of the ferroelectric of the ferroelectric capacitor module. In this case, experiments have shown that the adhesion layer oxidizes more rapidly, the longer the heat treatment process lasts and the higher the temperature during the heat treatment. Such experimental investigations have also shown that the lateral oxidation under the oxygen barrier takes place more slowly.

According to the invention, the adhesion layer does not need to be patterned since, in the region between the capacitor modules where it initially produces a short circuit, it is the first to oxidize during the heat treatment of the ferroelectric and thus acts in an electrically insulating manner.

As a result, on the one hand, the patterning of this adhesion layer is obviated and, on the other hand, this layer can even serve for the "gettering" of oxygen. The unpatterned adhesion layer additionally obstructs the further diffusion of oxygen under the oxygen barrier.

If, as is preferred, TaSiN or TaN is used as the material for the adhesion layer, tantalum can be used as the end point signal, for example, during patterning the ferroelectric capacitor module by reactive ion etching the oxygen barrier/bottom capacitor electrode.

As an alternative, etching can also be effected selectively, so that the material of the adhesion layer serves as an etching stop. This avoids an additional elevation of the topography through overetching into the intermediate oxide.

With the foregoing and other objects in view there is provided, in accordance with the invention, a method for producing ferroelectric capacitors in an integrated semiconductor memory chip. The method includes steps of: constructing the ferroelectric capacitors in accordance with a stacked principle; forming an oxygen barrier between a metallic bottom capacitor electrode of a ferroelectric capacitor and a conductive plug connecting the bottom capacitor electrode to a semiconductor electrode lying below the ferroelectric capacitor or to a metallization track; configuring an unpatterned adhesion layer made of a conductive material in a region having the ferroelectric capacitors and configuring the adhesion layer between the plug and the oxygen barrier; and performing a heat treatment step to oxidize sections of the adhesion layer that are not covered by the oxygen barrier and to thereby convert the sections of the adhesion layer into an insulating layer.

Other features which are considered as characteristic for the invention are set forth in the appended claims.

Although the invention is illustrated and described herein as embodied in a method for producing ferroelectric capacitors and integrated semiconductor memory chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
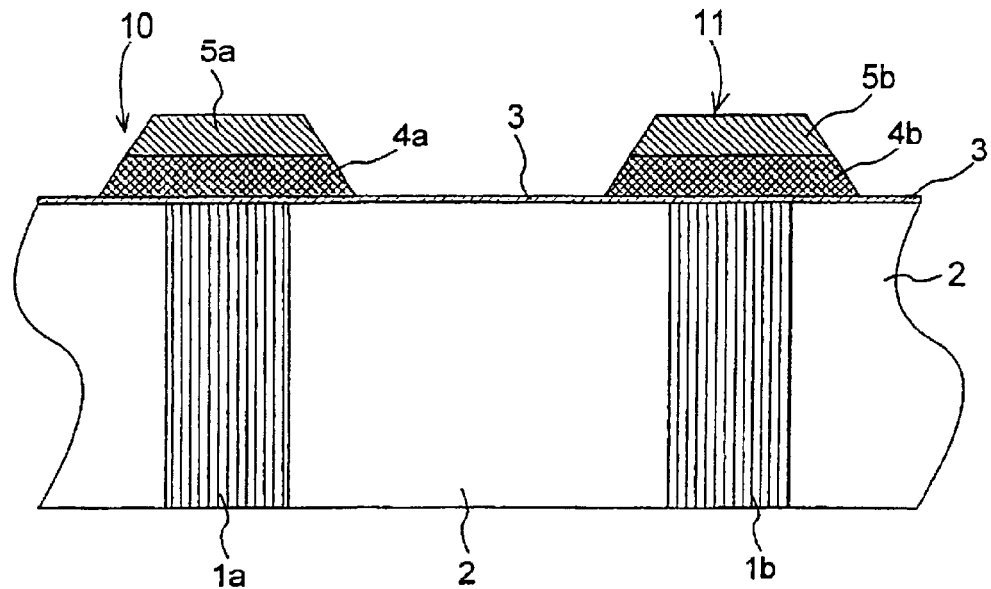
FIG. 1 is a diagrammatic cross sectional view through a section of an integrated semiconductor memory, illustrating structures of ferroelectric capacitor modules constructed by the stacked principle with an unpatterned continuous adhesion layer.

Referring now to the figures of the drawing in detail and first, particularly, to FIG. 1 thereof, there is shown a cross-sectional illustration that in each case shows oxygen barriers 4a, 4b and, above the latter, bottom electrode sections 5a, 5b of two ferroelectric capacitor modules 10 and 11. Between the oxygen barriers 4a, 4b and the conductive plugs 1a, 1b, which may be composed of tungsten or polysilicon, an unpatterned adhesion layer 3, which includes TaSiN, TaN, Ta, TiN, Ti, for example, is formed in a continuous fashion. That is to say, over the entire region of an integrated semiconductor memory chip which has ferroelectric capacitors. The adhesion layer 3 thus lies between the oxygen barriers 4a, 4b, which are intended to prevent an oxidation of the polysilicon or tungsten plug 1a, 1b in the stacked construction of the ferroelectric capacitors, and the plugs 1a, 1b. The adhesion layer 3 is formed over the whole area of an intermediate oxide layer 2, which fills the intermediate sections between the conductive plugs 1a, 1b.

It should be mentioned that, apart from its function as an adhesion promoter, the adhesion layer 3 is necessary in order to keep down the contact resistance between the plugs 1a, 1b and the associated oxygen barrier 4a, 4b and in order to prevent possible siliciding of Ir.

Consequently, according to the invention, the adhesion layer 3 remains unpatterned, in other words it is not removed selectively where it is not covered by the oxygen barriers 4a, 4b.

Figure 2:
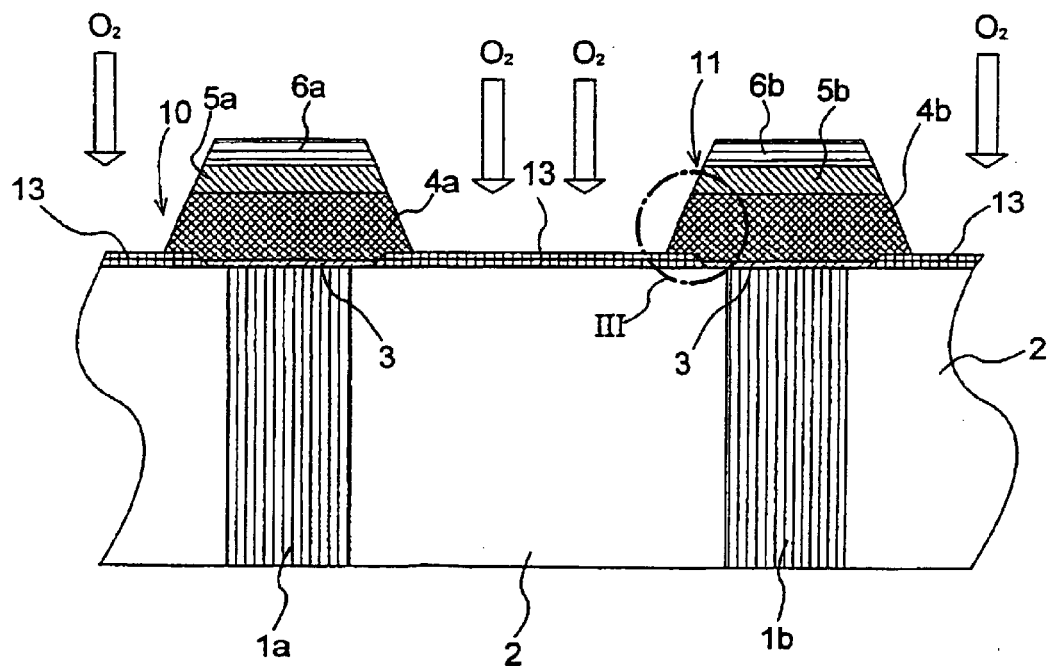
FIG. 2 is a diagrammatic cross sectional view through a section of a semiconductor memory for illustrating a heat treatment step carried out after the deposition of the ferroelectric, in which the uncovered regions of the adhesion layer are oxidized.

Instead, as shown in FIG. 2, the adhesion layer 3 is oxidized, to be precise by oxygen $O_2$ (see the greatly hatched arrows in FIG. 2), as is liberated in the course of a heat treatment process that takes place anyway for the ferroelectric layer 6a, 6b. It should be mentioned here that the bottom capacitor electrodes 5a, 5b are composed of a noble metal or a metal oxide that withstands high temperatures in $O_2$. Examples of appropriate substances for this are:

Pt, Pd, Ir, Rh, Ru, RuOx, IrO$_x$, RhO$_x$, SrRuO$_3$, LaSrCoO$_x$ (LSCO for short), HT superconductors such as YBa$_2$Cu$_3$O$_7$ and other suitable materials. As a result of the oxidation, the adhesion layer 3, where it is not covered by the oxygen barriers 4a, 4b, is converted into an oxide layer 13 having an electrically insulating property, so that the bottom capacitor electrodes are electrically insulated from one another.

Figure 3:
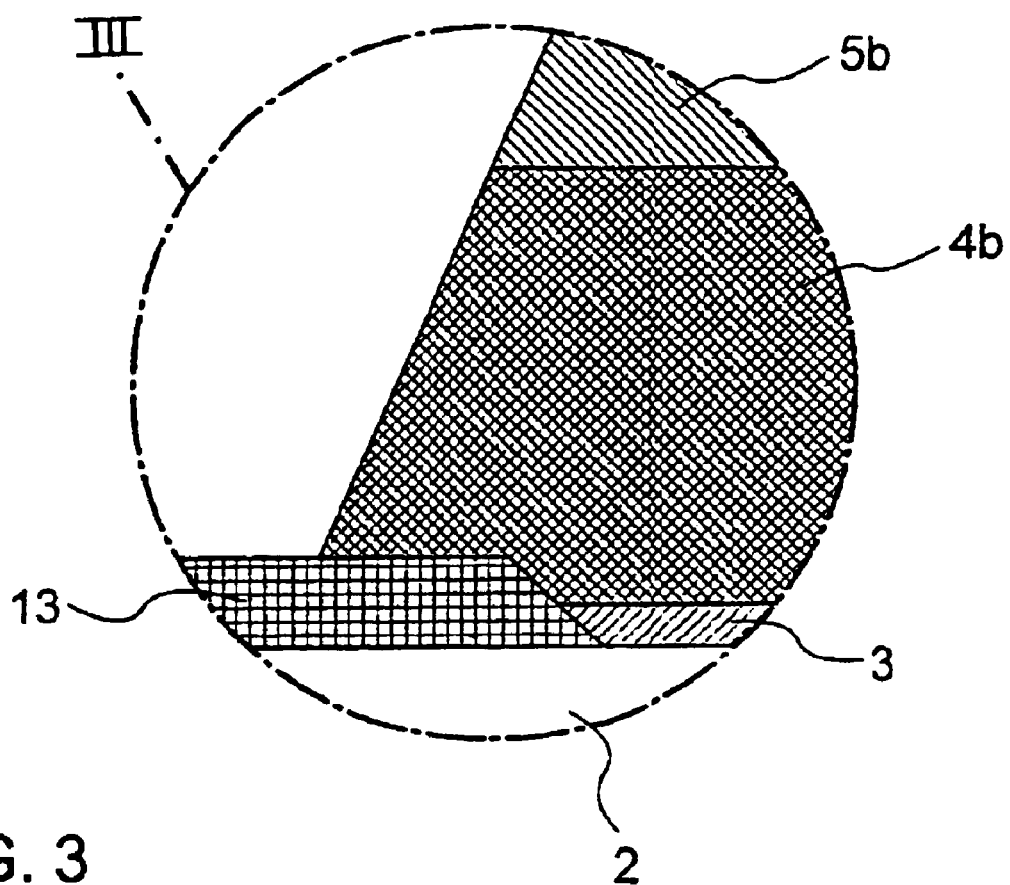
FIG. 3 is a detail view of the portion of a ferroelectric capacitor module that is shown in circle III in FIG. 2.

The view III illustrated in FIG. 3 clearly shows that the oxidation process for the adhesion layer 3 continues to a point under the oxygen barriers 4a, 4b, so that the edges of the oxygen barriers 4a, 4b overlap the oxidized regions somewhat.

The inventive production method results in a ferroelectric semiconductor memory with ferroelectric capacitors constructed according to the stacked principle, in which case, on the one hand, the patterning of the adhesion layer 3 is obviated and, on the other hand, this layer can even serve for gettering oxygen. The unpatterned adhesion layer 3 additionally obstructs the diffusion of oxygen under the oxygen barriers 4a, 4b through the adhesion layer.

During patterning by reactive ion etching of the oxygen barriers 4a, 4b and/or of the bottom capacitor electrodes 5a, 5b, tantalum, for example, can be used as an end point signal if the adhesion layer 3 includes TaSiN or TaN.

During selective etching of the oxygen barriers 4a, 4b and/or of the bottom capacitor electrodes 5a, 5b, the unpatterned material of the adhesion layer 3 can serve as an etching stop. This avoids an additional elevation of the topography through difficult-to-avoid overetching into the intermediate oxide 2.

We claim:

1. A method for producing ferroelectric capacitors in an integrated semiconductor memory chip, the method which comprises:

constructing the ferroelectric capacitors in accordance with a stacked principle;

forming an oxygen barrier between a metallic bottom capacitor electrode of a ferroelectric capacitor and a conductive plug connecting the bottom capacitor electrode to a semiconductor electrode lying below the ferroelectric capacitor or to a metallization track;

configuring an unpatterned adhesion layer made of a conductive material in a region having the ferroelectric capacitors and configuring the adhesion layer between the plug and the oxygen barrier; and performing a heat treatment step to oxidize sections of the adhesion layer that are not covered by the oxygen barrier and to thereby convert the sections of the adhesion layer into an insulating layer.

2. The production method according to claim 1, wherein the heat treatment step is performed for depositing a ferroelectric of the ferroelectric capacitors.

3. The production method according to claim 1, wherein the adhesion layer contains Ta.

4. The production method according to claim 1, which comprises making the conductive plug from polysilicon or tungsten.

5. The production method according to claim 1, wherein the sections of the adhesion layer that are oxidized also extend under edge regions of the oxygen barrier.

6. The production method according to claim 1, wherein the ferroelectric capacitors form an operative part of the integrated semiconductor memory chip.

* * * * *